United States Patent
Takada

(10) Patent No.: US 9,583,370 B2
(45) Date of Patent: Feb. 28, 2017

(54) ARTICLE TRANSPORT FACILITY

(71) Applicant: Daifuku Co., Ltd., Osaka-shi (JP)

(72) Inventor: Ayato Takada, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/937,213

(22) Filed: Nov. 10, 2015

(65) Prior Publication Data

US 2016/0133492 A1 May 12, 2016

(30) Foreign Application Priority Data

Nov. 12, 2014 (JP) ................................. 2014-230063

(51) Int. Cl.
| | | |
|---|---|---|
| B65G 37/00 | (2006.01) |
| B65G 43/08 | (2006.01) |
| B65G 49/02 | (2006.01) |
| H01L 21/00 | (2006.01) |
| H01L 21/677 | (2006.01) |
| H01L 21/673 | (2006.01) |

(52) U.S. Cl.
CPC .. *H01L 21/67733* (2013.01); *H01L 21/67393* (2013.01); *H01L 21/67736* (2013.01)

(58) Field of Classification Search
CPC ........... H01L 21/6735; H01L 21/67389; H01L 21/67769; H01L 21/67393
USPC ............... 414/217, 298, 300, 277, 281, 940; 198/343.1, 346.1, 346.2
See application file for complete search history.

(56) References Cited

U.S. PATENT DOCUMENTS

| | | | | | |
|---|---|---|---|---|---|
| 5,411,358 | A | * | 5/1995 | Garric ................. | G03F 7/70541 414/277 |
| 6,092,980 | A | * | 7/2000 | Kumasaka ........ | H01L 21/67242 414/147 |
| 6,123,120 | A | * | 9/2000 | Yotsumoto ........ | H01L 21/67389 141/59 |
| 6,261,044 | B1 | * | 7/2001 | Fosnight ........... | H01L 21/67772 414/217 |
| 6,637,998 | B2 | * | 10/2003 | Langan ............. | H01L 21/67724 414/217 |
| 7,077,173 | B2 | * | 7/2006 | Tokunaga ......... | H01L 21/67017 141/66 |
| 8,297,319 | B2 | * | 10/2012 | Babbs ............... | H01L 21/67393 141/4 |
| 8,366,370 | B2 | * | 2/2013 | Nakamura ........ | H01L 21/67772 414/217 |

(Continued)

FOREIGN PATENT DOCUMENTS

JP 201244033 A 3/2012

*Primary Examiner* — Douglas Hess
(74) *Attorney, Agent, or Firm* — The Webb Law Firm

(57) ABSTRACT

An article transport facility includes a connecting actuator device for moving an eject portion of an inactive gas supplying device relative to a support portion of a ceiling transport vehicle in order to change the positional relationship between the support portion and the eject portion between a connecting positional relationship and a separating positional relationship. The inactive gas supplying device is configured to eject the inactive gas from the eject portion with the connection between the eject portion and the container maintained after the positional relationship between the support portion and the eject portion is changed to the connecting positional relationship.

9 Claims, 10 Drawing Sheets

(56) References Cited

U.S. PATENT DOCUMENTS

| | | | |
|---|---|---|---|
| 8,522,836 B2* | 9/2013 | Okabe | H01L 21/67393 |
| | | | 141/286 |
| 8,596,312 B2* | 12/2013 | Natsume | H01L 21/67775 |
| | | | 141/63 |
| 8,926,251 B2 | 1/2015 | Izuka et al. | |
| 8,984,744 B2* | 3/2015 | Flitsch | H01L 21/67017 |
| | | | 29/729 |
| 9,064,918 B2* | 6/2015 | Takahara | H01L 21/67769 |
| 9,212,786 B2* | 12/2015 | Naylor | F17D 1/04 |
| 9,224,628 B2* | 12/2015 | Bufano | H01L 21/67017 |

* cited by examiner

ARTICLE TRANSPORT FACILITY

CROSS-REFERENCE TO RELATED APPLICATION

This application claims priority to Japanese Patent Application No. 2014-230063 filed Nov. 12, 2014, the disclosure of which is hereby incorporated in its entirety by reference.

FIELD OF THE INVENTION

The present invention relates to an article transport facility comprising an article transport vehicle configured to travel along a travel rail suspended from a ceiling to transport a container wherein the article transport vehicle includes a support portion for supporting the container.

BACKGROUND

An example of an article transport facility, such as one described above is described in JP Publication of Application No. 2012-044033 (Patent Document 1). In the article transport facility of Patent Document 1, a container storage for storing an article is provided to a side of a travel path along which an article transport vehicle travels. And an inactive gas supplying device for ejecting inactive gas from an eject portion is provided to the container storage. As such, by providing the container storage with the inactive gas supplying device, the article transport facility of Patent Document 1 is configured to supply inactive gas into the container making use of the time the container is stored in the container storage.

To describe in more detail, the article transport vehicle includes a vertical movement actuator for vertically moving a support portion for supporting a container. And the container storage includes a horizontal movement actuator by which the eject portion is moved horizontally. And after the article transport vehicle is stopped at a travel stop position defined in advance for the container storage, the eject portion is projected horizontally by the horizontal movement actuator so as to position the eject portion directly below the container supported by the support portion of the article transport vehicle. Subsequently, the support portion is lowered by the vertical movement actuator to connect the container to the eject portion.

As such, by horizontally moving the eject portion with the horizontal movement actuator and vertically moving the support portion with the vertical movement actuator, the positional relationship between the support portion and the eject portion can be changed between a connecting positional relationship in which the eject portion is connected to the container supported by the support portion and a separating positional relationship in which the eject portion is separated from the container supported by the support portion.

Incidentally, in the article transport facility of Patent Document 1, the nitrogen gas supply passage for supplying inactive gas to the eject portion becomes disconnected at its intermediate location when the eject portion is horizontally moved by the horizontal movement actuator. As such, the inactive gas supplying device is configured such that it cannot eject the inactive gas through the eject portion when the eject portion is projected horizontally by the horizontal movement actuator.

Therefore, in the article transport facility of Patent Document 1, in order to eject inactive gas from the eject portion to supply the inactive gas to the container, the ceiling transport vehicle releases the support of the container by the support portion after the container is connected to the eject portion, and the inactive gas supplying device causes the eject portion to be retracted horizontally by the horizontal movement actuator to cause the nitrogen gas supply passage to be re-connected at the intermediate location. In the conventional article transport facility, the inactive gas supplying device is configured to eject inactive gas from the eject portion to supply inactive gas to the container after the eject portion is retracted as described above.

SUMMARY OF THE INVENTION

In the conventional article transport facility described above, after the article transport vehicle transports a container to the article storage, the article transport vehicle is caused to travel from the travel stop position to transport a next container. And when the container needs to be transported from the article storage, another article transport vehicle is caused to travel to the travel stop position so that the article transport vehicle can transport the article to another location from the article storage.

When transporting a container, to which inactive gas has been supplied by the inactive gas supplying device, to an article storage at other location, another article transport vehicle needs to be caused to travel to the travel stop position, and then the vertical movement actuator of the article transport vehicle and the horizontal movement actuator of the inactive gas supplying device need to be activated to move the support portion and the eject portion relative to each other so as to bring them into a positional relationship in which the support portion can support the container, and then to move the support portion and the eject portion relative to each other so as to separate the eject portion from the container. As such, it is difficult to quickly transport to another location a container to which inactive gas has been supplied by the inactive gas supplying device.

Thus, an article transport facility is desired with which a container to which inactive gas has been supplied by the inactive gas supplying device can be transported quickly to another location.

A feature of an article transport facility is that it comprises: an article transport vehicle configured to travel along a travel rail suspended from a ceiling to transport a container wherein the article transport vehicle includes a support portion for supporting the container; an inactive gas supplying device having an eject portion for ejecting inactive gas such that the eject portion is located to a side of, or below, a travel path along which the article transport vehicle is configured to travel; a connecting actuator device for moving the eject portion relative to the support portion to change a positional relationship between the support portion and the eject portion between a connecting positional relationship in which the eject portion is connected to the container supported by the support portion and a separating positional relationship in which the eject portion is separated from the container supported by the support portion; wherein the inactive gas supplying device is configured to eject the inactive gas from the eject portion with a connection between the eject portion and the container maintained after the positional relationship between the support portion and the eject portion is changed to the connecting positional relationship by the connecting actuator device.

With the characterizing arrangement described above, the eject portion can be connected to the container supported by the support portion of the article transport vehicle by moving the eject portion relative to the support portion with the connecting actuator device to change the positional relationship between the support portion and the eject portion to the connecting positional relationship after the article transport vehicle is caused to travel to and has reached the position that corresponds to the inactive gas supplying device.

In addition, the eject portion can be separated from the container supported by the support portion of the article transport vehicle by moving the eject portion relative to the support portion with the connecting actuator device to change the positional relationship between the support portion and the eject portion to the separating positional relationship with the article transport vehicle stopped at the position that corresponds to the inactive gas supplying device.

And the eject portion is connected to the container with the connection between the eject portion and the container maintained after the positional relationship between the support portion and the eject portion is changed to the connecting positional relationship; thus, the inactive gas can be supplied to the container when the inactive gas supplying device ejects the inactive gas from the eject portion in this state.

In addition, the article transport vehicle is located at the position corresponding to the inactive gas supplying device while the inactive gas is being supplied to the container in this manner. Thus, the container comes to be supported by the support portion of the article transport vehicle simply by changing the positional relationship between the support portion and the eject portion to the separating positional relationship by the connecting actuator device, so that the article transport vehicle is then ready to travel, supporting the container with the support portion. As such, the container to which the inactive gas has been supplied by the inactive gas supplying device can be transported quickly to another location by the article transport vehicle.

DETAILED DESCRIPTION

Embodiments of an article transport facility are described next with reference to the drawings.

Figure 1:
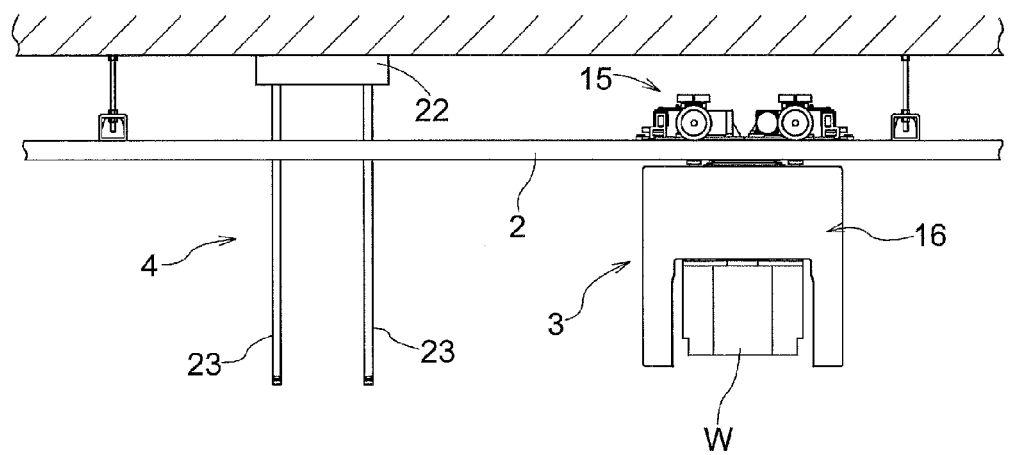
FIG. 1 is a side view of an article transport facility.
Figure 1:
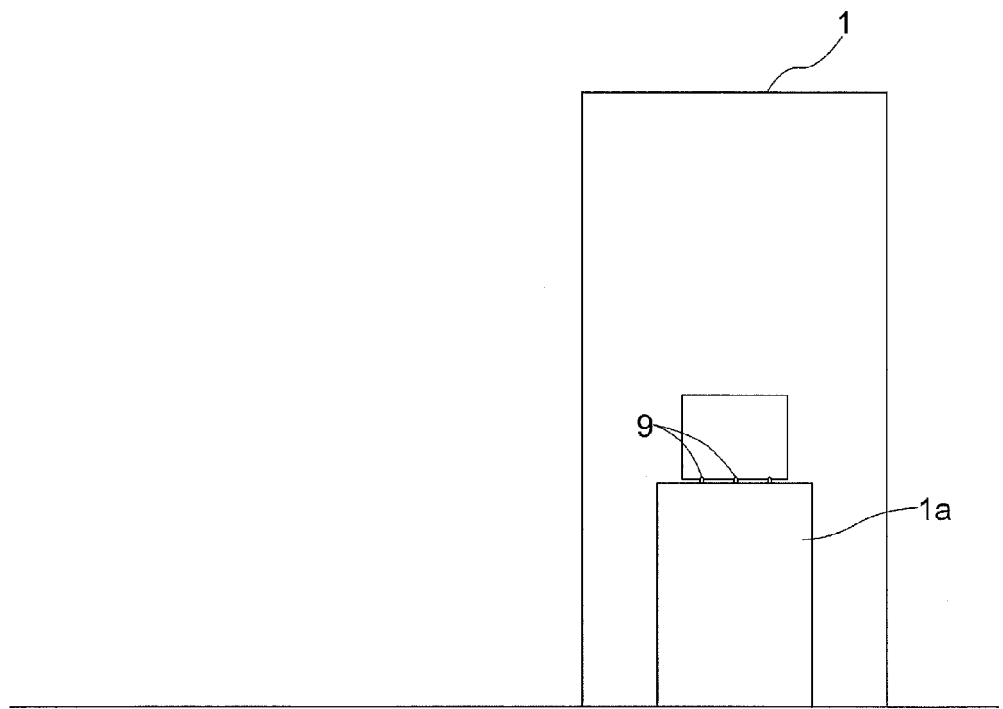
Figure 2:
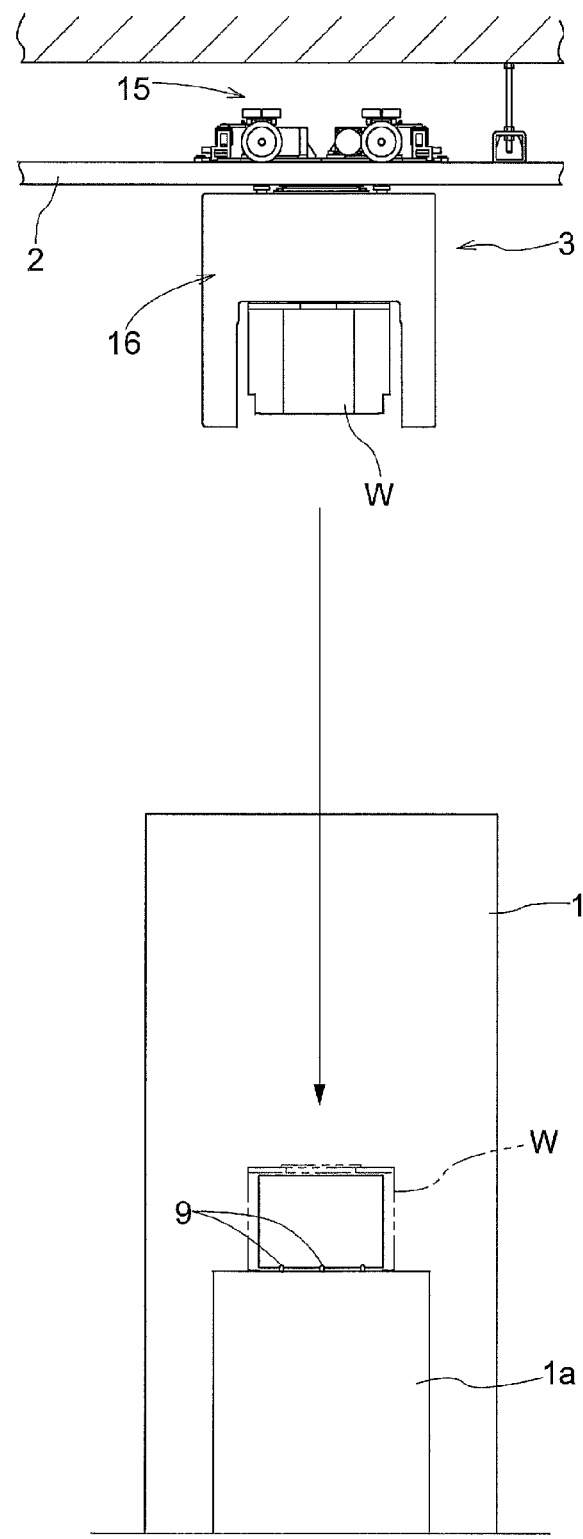
FIG. 2 is a side view of the article transport facility with a ceiling transport vehicle stopped at a transport stop position.

As shown in FIG. 1, the article transport facility includes travel rails 2 suspended from the ceiling such that the travel rails 2 extend along, or by way of, a plurality of processing devices 1, and a ceiling, or an overhead, transport vehicle 3 (article transport vehicle) configured to travel along the travel rails 2 to transport containers W, one at a time, among the plurality of processing devices 1. In addition, the article transport facility includes a nitrogen gas supplying device 4 (inactive gas supplying device) for supplying nitrogen gas, as inactive gas, to the container W supported by the ceiling transport vehicle 3.

In the present embodiment, each container W is a FOUP (Front Opening Unified Pod) for storing semiconductor substrates.

Each processing device 1 is a device for performing one or more predetermined operations on the work-in-process parts, etc. at various stages of manufacturing of semiconductor substrates. A support platform 1a provided to each processing device 1 for receiving and supporting a container W is, or corresponds to, a transport subject location that functions as a transport origin or a transport destination of transporting of a container W by the ceiling transport vehicle 3. Each support platform 1a is located directly below the travel path along which the ceiling transport vehicle 3 travels. Each nitrogen gas supplying device 4 is provided at a location displaced, along the longitudinal direction of the travel path, relative to the support platform 1a. Note that the travel path refers to space through which the ceiling transport vehicle 3 traveling along the travel rails 2a and the container W supported by the ceiling transport vehicle 3 move.

[Container]

Figure 4:
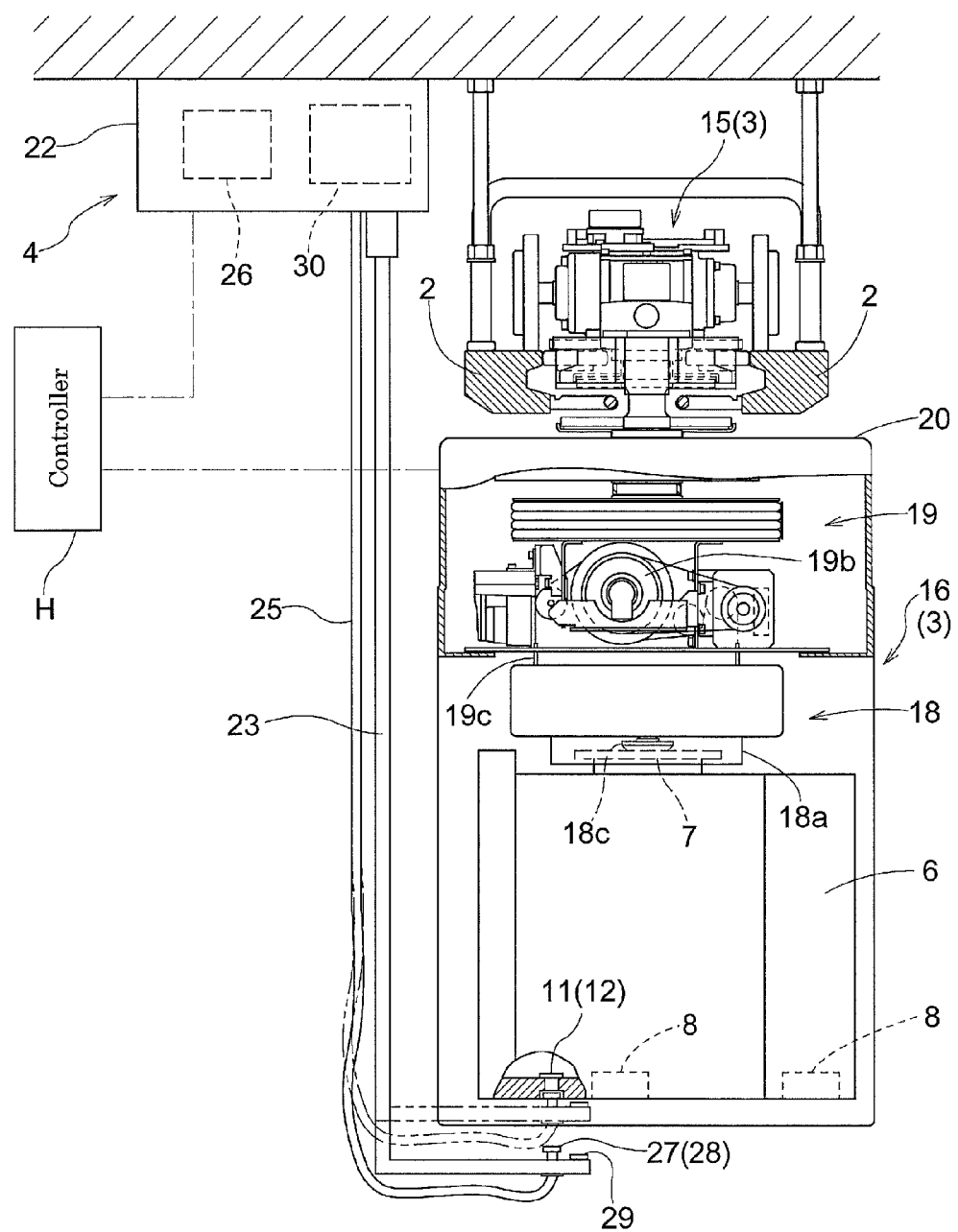
FIG. 4 is a front view of the ceiling transport vehicle stopped at a supply-purpose stop position.
Figure 5:
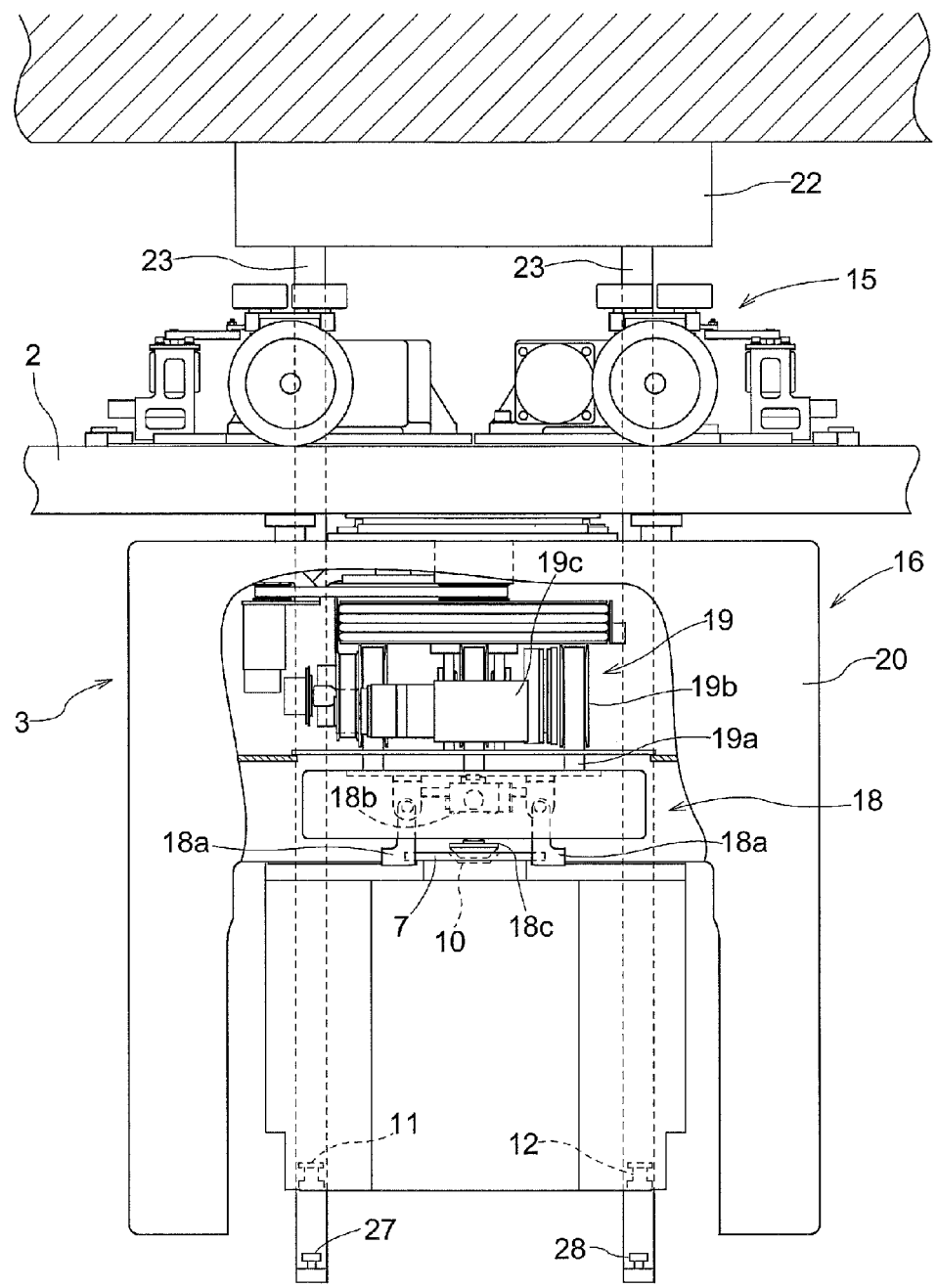
FIG. 5 is a side view of the ceiling transport vehicle stopped at the supply-purpose stop position.

As shown in FIGS. 4 and 5, each container W includes a container main body 6 for holding or carrying a plurality of semiconductor substrates, a flange portion 7 (supported portion) located above the container main body 6 and provided in an upper end portion of the container W, and a detachable lid (not shown) for closing a substrate entrance formed in the front face of the container main body 6 for inserting and removing the substrates.

As shown in FIG. 4, three bottom surface recessed portions 8 (engaged portions) are provided to, or formed in, the bottom surface of the container main body 6 (i.e., bottom surface of the container W). Each of the bottom surface recessed portions 8 is formed to taper toward its top. And the inner surfaces of each bottom surface recessed portion 8 are formed as sloped surfaces. In other words, each bottom surface recessed portion 8 is formed to be recessed upwardly and to have a shape whose lateral dimension (of opening) becomes progressively narrower toward the top.

Figure 3:
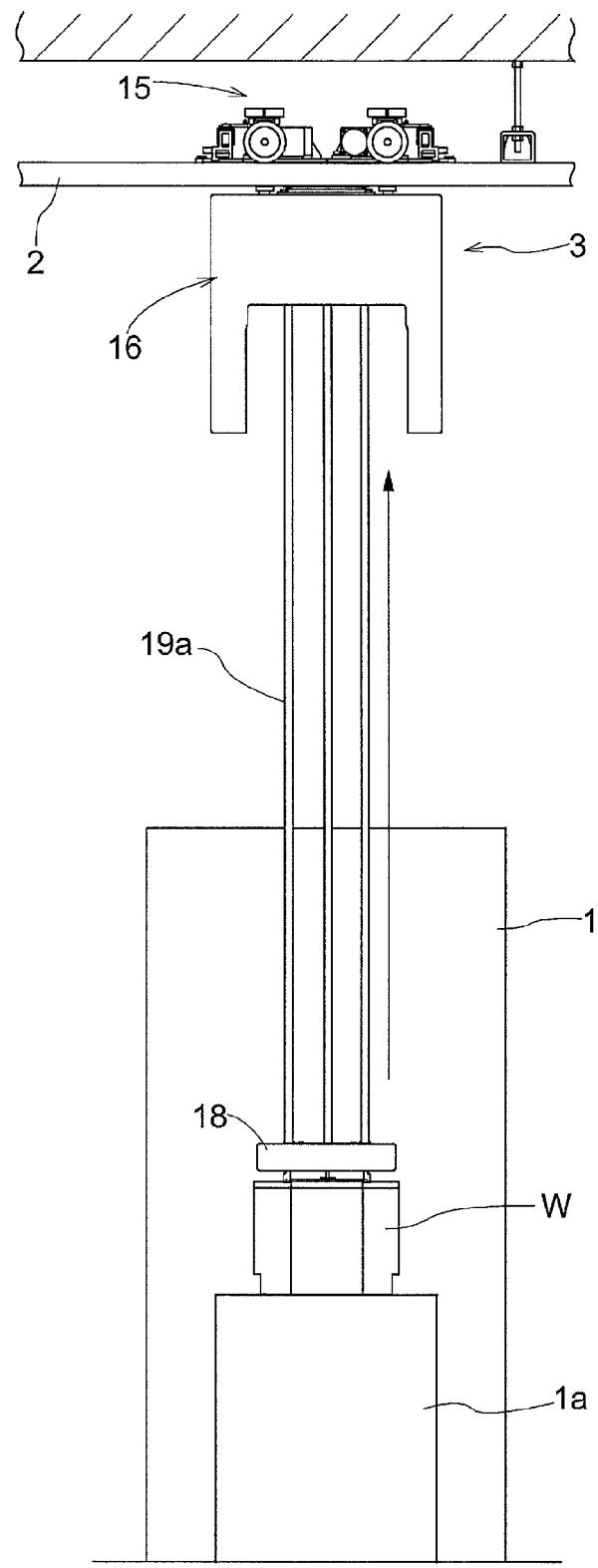
FIG. 3 is a side view of the article transport facility with a ceiling transport vehicle stopped at a transport-purpose stop position.

These bottom surface recessed portions 8 are provided such that, when the container W is transported to a support platform 1a by the ceiling transport vehicle 3 and is placed on the support platform 1a (see FIG. 3), positioning members 9 provided to the support platform 1a engage these bottom surface recessed portions 8 from below. If the container W is displaced horizontally relative to the support platform 1a when the container W is placed on the support platform 1a by the ceiling transport vehicle 3, the horizontal positioning of the container W relative to the support platform 1a is corrected to a proper position by the virtue of the fact that the positioning members 9 are guided by the inner surfaces of respective bottom surface recessed portions 8.

And the positioning member 9 are in engagement with the bottom surface recessed portions 8 of the container W from below when the container W is received and supported by the support platform 1a so that any horizontal displacement of the container W is restricted by the three positioning members 9 engaging the bottom surface recessed portions 8 and so that the container W is received and supported by the three positioning members 9 engaging respective bottom surface recessed portions 8.

As shown in FIG. 5, a top surface recessed portion 10 which is recessed downward is formed in the top surface of the flange portion 7 (top surface of the container W). The top surface recessed portion 10 is formed to taper toward its bottom so that the inner surfaces of the top surface recessed portion 10 are formed as sloped surfaces.

The top surface recessed portion 10 is configured such that, when the ceiling transport vehicle 3 lowers a support mechanism 18 with a container W placed on the support platform 1a, a pressing portion 18c provided to the support mechanism 18 comes into engagement with the top surface recessed portion 10. And if the support mechanism 18 is displaced horizontally relative to the container W received and supported by the support platform 1a when the ceiling transport vehicle 3 lowers the support mechanism 18, the horizontal position of the support mechanism 18 relative to the container W is corrected to a proper position by the virtue of the fact that the pressing portion 18c is guided by the inner surfaces of the top surface recessed portion 10.

As shown in FIG. 5, provided to the bottom surface of the container W are an intake opening 11 (intake portion) for allowing nitrogen gas ejected from the eject nozzle 27 of a nitrogen gas supplying device 4 into the container W, and an outlet opening 12 for allowing the gas to be discharged out from the container W. The intake opening 11 is provided with an intake opening and closing valve (not shown) whereas the discharge opening 12 is provided with an outlet opening and closing valve (not shown). In other words, the container W is configured to be sealed against leakage of gas by closing the substrate entrance with the lid and by closing each of the intake opening 11 and the outlet opening 12 with its opening and closing valve. In the present embodiment, the eject nozzle 27 is the "eject portion".

And the intake opening and closing valve of the intake opening 11 is urged toward its closed position by an urging member, such as a coil spring, and is configured such that, when the eject nozzle 27 of the nitrogen gas supplying device 4 is connected to the intake opening 11 and nitrogen gas is discharged from the eject nozzle 27, the intake opening and closing valve is opened by the pressure of the discharged nitrogen gas, allowing the nitrogen gas to be supplied into the container W.

In addition, the outlet opening and closing valve of the outlet opening 12 is urged toward its closed position by an urging member, such as a coil spring, and is configured such that, when the pressure inside the container W increases to a set value as the nitrogen gas is supplied by the nitrogen gas supplying device 4, the outlet opening and closing valve is opened, allowing the gas inside the container W to be discharged out.

[Ceiling Transport Vehicle]

As shown in FIGS. 4 and 5, the ceiling, or overhead, transport vehicle 3 includes a travel portion 15 which is configured to travel on, and along, the travel rails 2, a main body portion 16 which is located below the travel rails 2 and is suspended from and supported by the travel portion 15, and which is configured to support a container W such that the container can be moved vertically, or raised and lowered.

The main body portion 16 includes a support mechanism 18 which functions as a support portion for supporting a container W, a vertically moving mechanism 19 for vertically moving the support mechanism 18, and a cover member 20 which covers an area above the container W, and areas in front and back, along the direction of the travel path, of the container W supported by the support mechanism 18 in a raised position.

The vertically moving mechanism 19 includes spooling members 19b for spooling spool belts 19a whose distal ends are connected to the support mechanism 18 to support the support mechanism 18, and a vertical movement motor 19c for drivingly rotating the spooling member 19b. And the vertically moving mechanism 19 is configured to vertically move the support mechanism 18 and the container W supported thereby, by drivingly rotating the spooling member 19b in a forward direction and a reverse direction with the vertical movement motor 19c to spool and feed out the spool belts 19a.

The support mechanism 18 includes a pair of gripping claws 18a which can be pivoted about respective laterally or horizontally extending axes, gripper motors 18b (switching actuator device) for causing the pair of gripping claws 18a to be pivoted about respective laterally extending axes, and a pressing portion 18c for establishing, or adjusting, the position of the support mechanism 18 relative to the container W by pressing down, from above, on the container W located at the transport origin as the support mechanism 18 is lowered. By causing the pair of gripping claws 18a to be pivoted toward and away from each other with the pair of gripper motors 18b, the support mechanism 18 is configured to be able to switch, or change, between a support state in which the pair of gripping claws 18a are moved toward and close or closer to each other to support the flange portion 7 of the container W, and a support releasing state in which the pair of gripping claws 18a are moved away from and farther apart from each other to release the flange portion 7.

Each of the pair of gripping claws 18a is configured to support the flange portion 7 from below with a lower end portion thereof. When the flange portion 7 is supported by the pair of gripping claws 18a, a central portion of each gripping claw 18a along the vertical direction is located to a side of the flange portion 7. Note that the lower end portion of each gripping claw 18a is, or correspond to, the support body for supporting the flange portion 7 whereas the vertically central portion of each gripping claw 18a is, or corresponds to, the restricting portion located to a side of the flange portion 7 for restricting a horizontal movement of the flange portion 7 when the flange portion 7 is supported by the lower end portions of the pair of gripping claws 18a.

[Nitrogen Gas Supplying Device]

As shown in FIGS. 4 and 5, the nitrogen gas supplying device 4 includes a device main body 22 which is installed to the ceiling and located above the travel path of the ceiling transport vehicle 3, and nozzle supports 23 which are suspended from and supported by the device main body 22 and extend to locations below the travel path of the ceiling transport vehicle 3.

In addition, the nitrogen gas supplying device 4 includes a nitrogen gas supply passage 25 through which the nitrogen gas flows, a switching valve 26 provided at an intermediate location of the nitrogen gas supply passage 25, an eject nozzle 27 located at an downstream end portion of the nitrogen gas supply passage 25, and configured to be connected to the intake opening 11 of the container W, a discharge nozzle 28 configured to be connected to the outlet opening 12 of the container W, and a connection sensor 29 for detecting the state of the connection of the eject nozzle 27 to the intake opening 11 of the container W.

The nitrogen gas supply passage 25 extends from a supply source of the nitrogen gas, through the device main body 22, and to the lower end portion of the nozzle support 23. The switching valve 26 is provided to the device main body 22. And the eject nozzle 27, the discharge nozzle 28, and the connection sensor 29 are supported by respective nozzle supports 23.

The nitrogen gas supplying device 4 is configured to eject the nitrogen gas, supplied by the supply source (not shown), from the eject nozzle 27, and to be switched or changed through the switching action of the switching valve 26 between an injecting state for injecting the nitrogen gas from the eject nozzle 27 and a non-injecting state for not injecting the nitrogen gas from the eject nozzle 27.

And the nitrogen gas supplying device 4 is provided such that the eject nozzle 27 and the discharge nozzle 28 are located directly below the travel path along which the ceiling transport vehicle 3 travels. And when the ceiling transport vehicle 3 is stopped at a supply-purpose stop position defined in advance relative to the nitrogen gas supplying device 4, the eject nozzle 27 is located directly below the intake opening 11 of the container W supported by the ceiling transport vehicle 3, and the discharge nozzle 28 is located directly below the outlet opening 12 of the container W supported by the ceiling transport vehicle 3.

The article transport facility includes a connecting motor 30 which functions as a connecting actuator device for moving the eject nozzle 27 relative to the support mechanism 18 to change the positional relationship between the support mechanism 18 and the eject nozzle 27 between a connecting positional relationship in which the eject nozzle 27 is connected to the container W supported by the support mechanism 18 and a separating positional relationship in which the eject nozzle 27 is separated from the container W supported by the support mechanism 18.

As shown in FIG. 4, the connecting motor 30 is provided to the device main body 22 of the nitrogen gas supplying device 4 and is configured to raise and lower the nozzle supports 23 linearly along the vertical direction by the actuating force of the connecting motor 30.

In other words, with the ceiling transport vehicle 3 stopped at the supply-purpose stop position defined in advance relative to the nitrogen gas supplying device 4, the connecting positional relationship is achieved by activating the connecting motor 30 to raise the nozzle supports 23 to a raised position whereas the separating positional relationship is achieved by activating the connecting motor 30 to lower the nozzle supports 23 to a lowered position.

Thus, the connecting motor 30 is configured to raise and lower the eject nozzle 27 (out of the eject nozzle 27 and the support mechanisms 18) by raising and lowering the nozzle supports 23 along the vertical direction to change the positional relationship between the support mechanism 18 and the eject nozzle 27 between the connecting positional relationship and the separating positional relationship.

And when in the separating positional relationship, the eject nozzle 27 and the discharge nozzle 28 are located below the travel path of the ceiling transport vehicle 3. However, when in the connecting positional relationship, the eject nozzle 27 and the discharge nozzle 28 are within the travel path of the ceiling transport vehicle 3. And as for the container W to which the nitrogen gas is supplied by the nitrogen gas supplying device 4, a portion or all of the container W is located within the travel path of the ceiling transport vehicle 3.

[Controller]

The operation of the ceiling transport vehicle 3 and the operation of the nitrogen gas supplying device 4 are controlled by the controller H shown in FIG. 4. The controller H is configured to control the operation of the ceiling transport vehicle 3, based on a transport command from a superordinate controller, to perform a receiving control for receiving a container W from a support platform 1a that is designated as the transport origin and a delivering control for delivering the container W to a support platform 1a that is designated as the transport destination. In addition, the controller H is configured to control the operation of the ceiling transport vehicle 3 and the operation of the nitrogen gas supplying device 4 to perform a supply control for supplying nitrogen gas to the container W supported by the ceiling transport vehicle 3.

Figure 6:
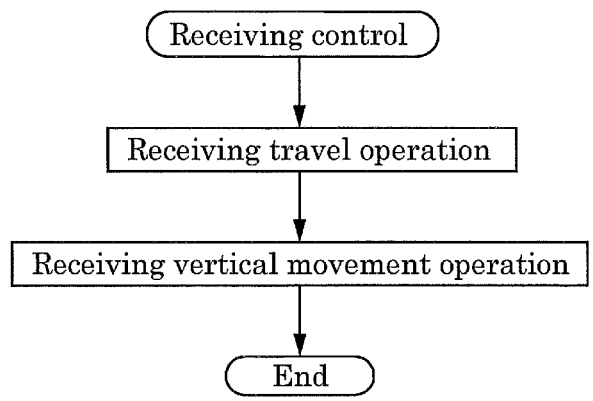
FIG. 6 is a flow chart for a receiving control.

As shown in the flow chart of FIG. 6, in the receiving control, the operation of the ceiling transport vehicle 3 is controlled to perform a receiving travel operation in which the ceiling transport vehicle 3 which is not supporting any container W is caused to travel to a transport-purpose stop position, and a receiving vertical movement operation in which, with the ceiling transport vehicle 3 stopped at a transport-purpose stop position, the support mechanism 18 is switched, or changed, to the gripping state, after feeding out the spool belts 19a, to receive a container W from the support platform 1a, after which the spool belts 19a are spooled. By performing the receiving control in this manner, the container W is taken off or picked up from the support platform 1a and is supported by the ceiling transport vehicle 3.

Figure 7:
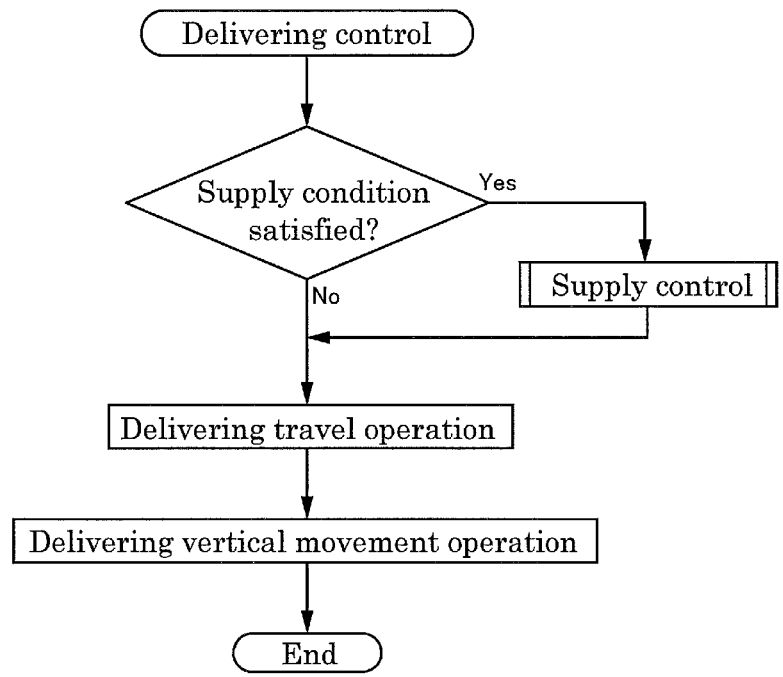
FIG. 7 is a flow chart for a delivering control.

As shown in the flow chart of FIG. 7, in the delivering control, the operation of the ceiling transport vehicle 3 is controlled to perform a delivering travel operation in which the ceiling transport vehicle 3 which is supporting a container W is caused to travel to a transport-purpose stop position for a support platform 1a, and a delivering vertical movement operation in which, with the ceiling transport vehicle 3 stopped at the transport-purpose stop position, the support mechanism 18 is switched, or changed, to the support releasing state, after feeding out the spool belts 19a, after which the spool belts 19a are spooled. By performing the delivering control in this manner, the container W supported by the ceiling transport vehicle 3 is unloaded onto the support platform 1a.

In addition, as shown in the flow chart of FIG. 7, immediately after starting the execution of the delivering control, the controller H determines whether a predetermined supply condition is satisfied, and interrupts the delivering control and performs a supply control if the supply condition is satisfied. Note that examples of the supply condition include a condition that a supply command for supplying nitrogen gas to the container W that is being transported has been issued by the superordinate controller, and a condition that the anticipated travel distance for the ceiling transport vehicle 3 from the transport origin to the transport destination is greater than or equal to a predetermined travel distance.

Note that the determination of whether the supply condition is satisfied may be made after the receiving control is completed and before the delivering control is started. And the control may be such that the supply control is performed if the supply condition is satisfied, and the delivering control is performed if the supply condition is not satisfied.

Figure 8:
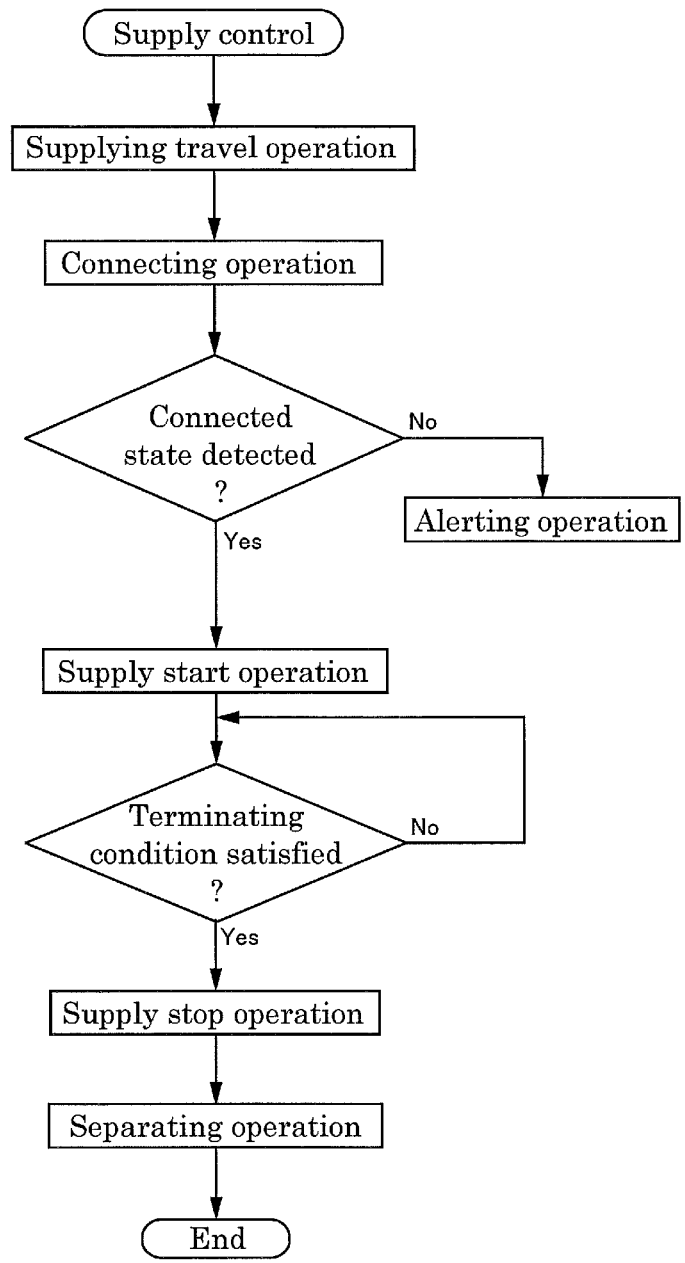
FIG. 8 is a flow chart for a supply control.

The supply control is described next with reference to the flow chart of FIG. 8.

In the supply control, the operation of the ceiling transport vehicle 3 is controlled firstly to perform a supplying travel operation in which the ceiling transport vehicle 3 which is supporting the container W is caused to travel to a supply-purpose stop position.

Then, the operation of the nitrogen gas supplying device 4 is controlled to perform a connecting operation in which, with the ceiling transport vehicle 3 stopped at the supply-purpose stop position, the nozzle supports 23 are raised to the raised position to change the positional relationship between the support mechanism 18 and the eject nozzle 27 to the connecting positional relationship. By performing the connecting operation in this manner, the eject nozzle 27 is connected to the intake opening 11 of the container W supported by the ceiling transport vehicle 3 while the discharge nozzle 28 is connected to the outlet opening 12 of the container W supported by the ceiling transport vehicle 3.

With the ceiling transport vehicle 3 stopped at the supply-purpose stop position and with the nozzle supports 23 raised to the raised position, the controller H performs: a supply start operation for opening the switching valve 26 if and when the connection sensor 29 detects a connected state (state in which the eject nozzle 27 is properly connected to the intake opening 11); and an alerting operation for activating a warning device if and when the connection sensor 29 does not detect the connected state.

By performing the supply start operation, nitrogen gas is ejected from the eject nozzle 27 to start supplying the nitrogen gas into the container W. And by performing the alerting operation, a warning device, such as a buzzer or a lamp, is activated to alert a worker that the eject nozzle 27 was not connected properly to the intake opening 11 in the supply control.

And if a predetermined terminating condition is satisfied during the supplying process of nitrogen gas after the nitrogen gas supply operation, the controller H controls the operation of the nitrogen gas supplying device 4 to first perform a supply stop operation for closing the switching valve 26, and then to perform the separating operation to cause the nozzle supports 23 to be lowered to the lowered position thus to switch or change the positional relationship between the support mechanism 18 and the eject nozzle 27 to the separating positional relationship. By performing the supply stop operation, the ejection of the nitrogen gas from the eject nozzle 27 is stopped, and thus the supplying of the nitrogen gas into the container W is completed.

Note that examples of the terminating condition include a condition that a termination command for stopping the supplying of nitrogen gas to the container W that is being transported is issued by the superordinate controller, and a condition that a predetermined set period has elapsed since the start of the supplying of nitrogen gas.

As described above, the ceiling transport vehicle 3 is stopped at the supply-purpose stop position and the support mechanism 18 is maintained in its supporting state from the time the controller H starts performing the connecting operation until it performs the separating operation.

And the nitrogen gas supplying device 4 is configured to be able to connect the eject nozzle 27 to the container W supported by the ceiling transport vehicle 3 and to eject nitrogen gas from the eject nozzles 27, with the ceiling transport vehicle 3 stopped at the supply-purpose stop position, and is configured to eject the inactive gas from the eject nozzle 27 with the positional relationship between the support mechanism 18 and the eject nozzle 27 maintained in the connecting positional relationship by the connecting actuator device. In other words, the nitrogen gas supplying device 4 is configured to eject the inactive gas from the eject nozzle 27 with the connection between the eject nozzle 27 and the container W maintained after the positional relationship between the support mechanism 18 and the eject nozzle 27 is switched or changed to the connecting positional relationship by the connecting actuator device. And in the present embodiment, the connection between the eject nozzle 27 and the container W is maintained by maintaining the positional relationship between the support mechanism 18 and the eject nozzle 27 in the connecting positional relationship by the connecting actuator device after the positional relationship between the support mechanism 18 and the eject nozzle 27 is switched or changed to the connecting positional relationship. In other words, in the present embodiment, the nitrogen gas supplying device 4 ejects the inactive gas from the eject nozzle 27 with the positional relationship between the support mechanism 18 and the eject nozzle 27 maintained in the connecting positional relationship in which the eject nozzle 27 is connected to the container W supported by the support mechanism 18.

Thus, the nitrogen gas supplying device 4 is configured to connect the eject nozzle 27 of the nitrogen gas supplying device 4 to the container W supported by the support mechanism 18 of the ceiling transport vehicle 3 after the ceiling transport vehicle 3 is stopped at the supply-purpose stop position to supply nitrogen gas into the container W. And since the ceiling transport vehicle 3 remains stopped at the supply-purpose stop position while the nitrogen gas is supplied to the container W with the nitrogen gas supplying device 4 in this manner, the container W can be transported quickly by the ceiling transport vehicle 3 after the supplying of the nitrogen gas is completed.

Alternative Embodiments (1) In the embodiment described above, nitrogen gas is supplied by the nitrogen gas supplying device 4 with the container W supported by the support mechanism 18; however, nitrogen gas may be supplied by the nitrogen gas supplying device 4 with the container W supported by the nitrogen gas supplying device 4.

Figure 9:
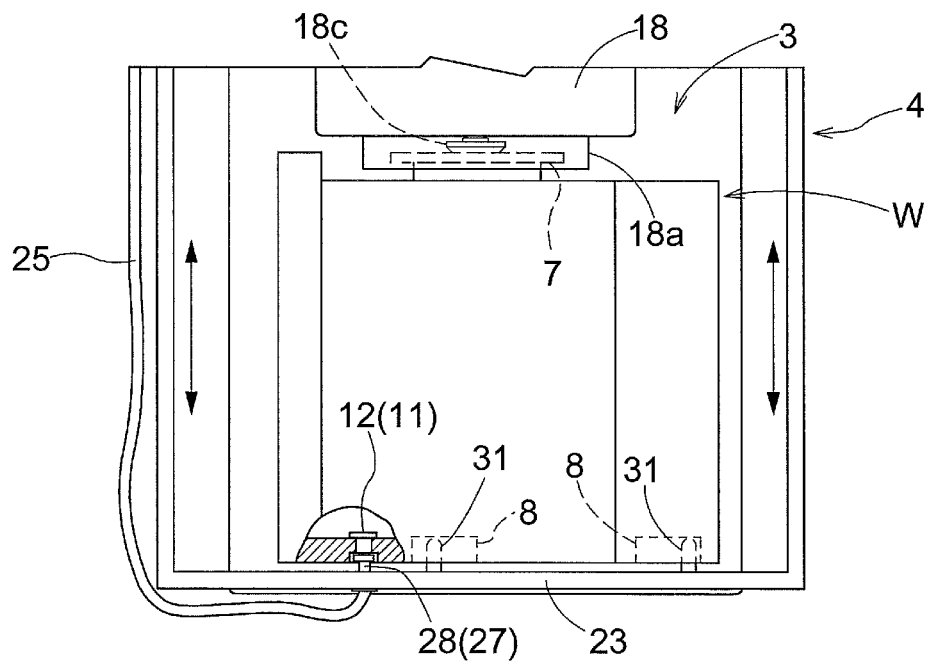
FIG. 9 is a front view of a principal portion of the ceiling transport vehicle and a nitrogen gas supplying device of the alternative embodiment (1)

Specifically, as shown in FIG. 9, three positioning support members 31 configured to engage the bottom surface recessed portion 8 of the container W are provided to the nozzle support 23 of the nitrogen gas supplying device 4. Each positioning support member 31 is formed to have a convex shape that projects upward. And when the nozzle supports 23 are raised to the raised position to switch or change the positional relationship between the support mechanism 18 and the eject nozzle 27 to the connecting positional relationship, the eject nozzle 27 is connected to the intake opening 11 and the discharge nozzle 28 is connected to the outlet opening 12 and the three support members 31 come into engagement with the three bottom surface recessed portions 8 of the container W. And by raising the nozzle supports 23 to a support position higher than the raised position, the container W is lifted by the three support members 31 such that the flange portion 7 of the container W is lifted upward from the gripping claws 18a. Thus the nitrogen gas may be supplied to the container W by the nitrogen gas supplying device 4 with the container W supported by the three support members 31 in this manner. In other words, in this alternative embodiment, the connection between the eject nozzle 27 and the container W is maintained by maintaining the positional relationship between the support mechanism 18 and the eject nozzle 27 in a positional relationship in which the eject nozzle 27 is connected to the container W supported by the nitrogen gas supplying device 4 (i.e., nozzle supports 23 in this embodiment) after the positional relationship between the support mechanism 18 and the eject nozzle 27 is switched or changed to the connecting positional relationship. And the nitrogen gas supplying device 4 ejects the inactive gas from the eject nozzle 27 with the positional relationship between the support mechanism 18 and the eject nozzle 27 maintained in the positional relationship in which the eject nozzle 27 is connected to the container W supported by the nitrogen gas supplying device 4.

While not shown, for example, the eject nozzle 27 may be provided with an interfering portion which is larger than the intake opening 11 while the discharge nozzle 28 may also be provided with an interfering portion which is larger than the outlet opening 12. And when the nozzle support 23 is raised to the raised position to switch or change the positional relationship between the support mechanism 18 and the eject nozzle 27 to the connecting positional relationship, the eject nozzle 27 is connected to the intake opening 11 and the discharge nozzle 28 is connected to the outlet opening 12 and the interfering portions provided to the eject nozzle 27 and the discharge nozzle 28 interfere, or come into contact with, the bottom surface of the container W. By raising the nozzle support 23 to the support position higher than the raised position, the container W is lifted by the two interfering portions such that the flange portion 7 of the container W is lifted upward from the gripping claws 18a. Thus, the nitrogen gas may be supplied by the nitrogen gas supplying device 4 with the container W supported by the two interfering portions in this manner. Even when the flange portion 7 of the container W is lifted upward from the gripping claws 18a in this manner, the container W can be prevented from falling by the virtue of the fact that the gripping claws 18a of the support mechanism 18 exist to the lateral sides of the flange portion 7 of the container W and the flange portion 7 of the container W comes into contact with the gripping claws 18a.

Note that, when the arrangements are made as described above in which the nitrogen gas is supplied by the nitrogen gas supplying device 4 with the container W supported by the nitrogen gas supplying device 4, arrangement may be made so that the flange portion 7 of the lifted container W is pressed down from above by the pressing portion 18c and so that the nitrogen gas is supplied by the nitrogen gas supplying device 4 with the container W held vertically by, and between, the nozzle support 23 and the pressing portion 18c.

Incidentally, when the container W is supported by the nitrogen gas supplying device 4, the nitrogen gas may be supplied to the container W by the nitrogen gas supplying device 4 with the support mechanism 18 in the support releasing state.

(2) In the embodiment described above, the connecting actuator device is provided to the nitrogen gas supplying device 4 to switch or change the positional relationship between the support mechanism 18 and the eject nozzle 27 between the connecting positional relationship and the separating positional relationship by moving the eject nozzle 27 with the connecting actuator device. However, the connecting actuator device may be provided to the ceiling transport vehicle 3 to switch or change the positional relationship between the support mechanism 18 and the eject nozzle 27 between the connecting positional relationship and the separating positional relationship by moving the support mechanism 18 with the connecting actuator device.

Figure 10:
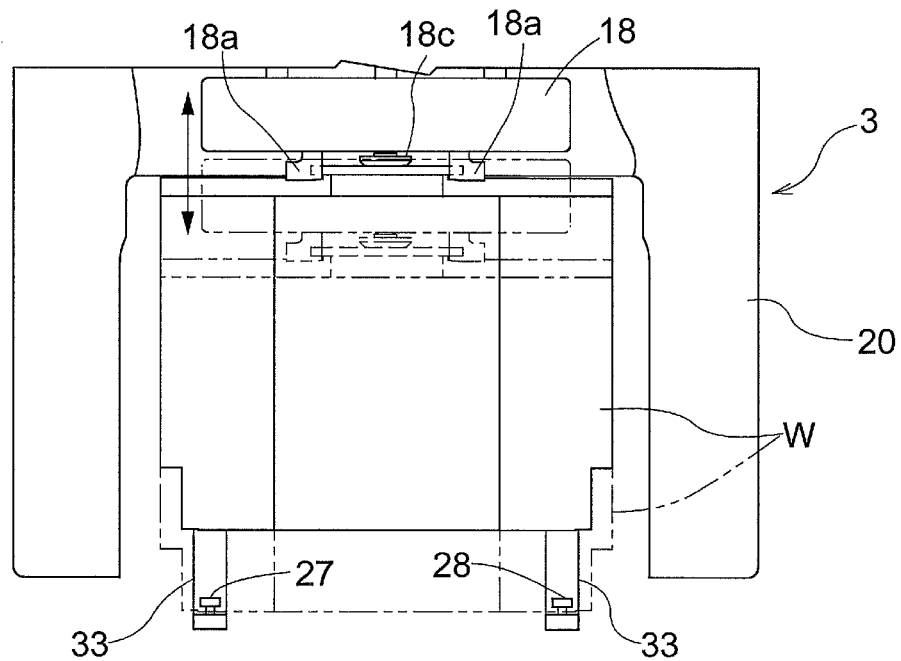
FIG. 10 is a side view of a principal portion of the ceiling transport vehicle and the nitrogen gas supplying device of the alternative embodiment (2)

More specifically, for example, as shown in FIG. 10, with the ceiling transport vehicle 3 stopped at the supply-purpose stop position, the positional relationship between the support mechanism 18 and the eject nozzle 27 may be switched or changed between the connecting positional relationship and the separating positional relationship by drivingly rotating the spooling member 19b with the vertical movement motor 19c to vertically move the support mechanism 18. In this case, the vertical movement motor 19c provided to the ceiling transport vehicle 3 can also be used as the connecting actuator device.

Figure 11:
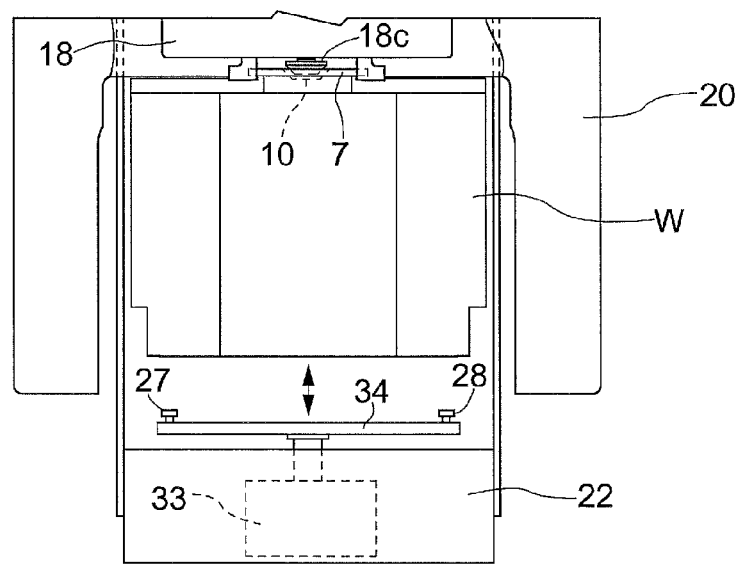
FIG. 11 is a side view of a principal portion of the ceiling transport vehicle and the nitrogen gas supplying device of the alternative embodiment (3)
Figure 12:
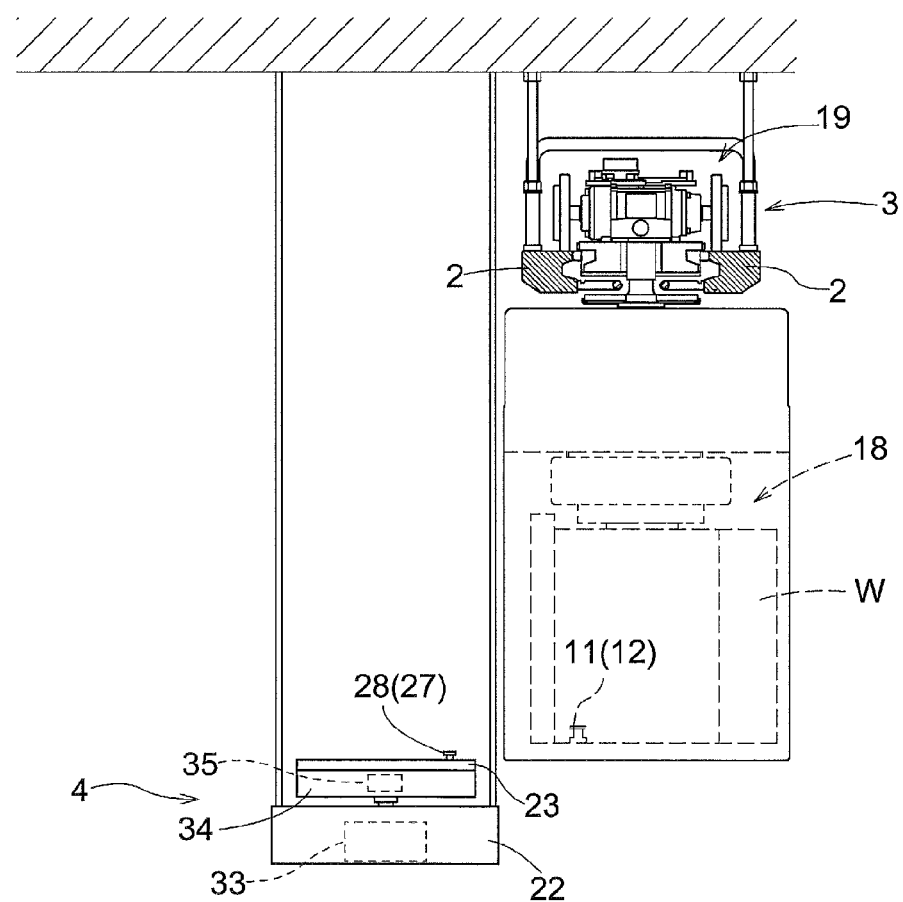
FIG. 12 is a front view of the ceiling transport vehicle and the nitrogen gas supplying device of the alternative embodiment (4)
Figure 13:
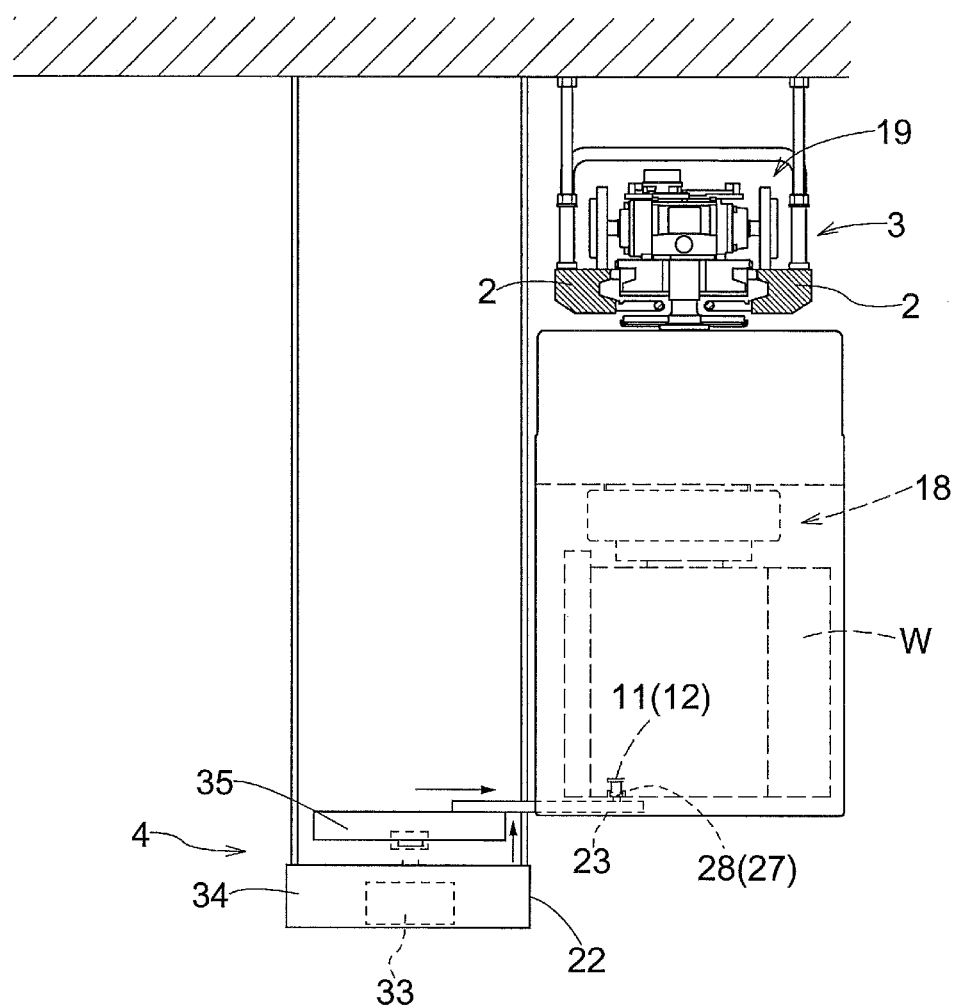
FIG. 13 is a front view of the ceiling transport vehicle and the nitrogen gas supplying device of the alternative embodiment (4).

(3) In the embodiment described above, the device main body 22 of the nitrogen gas supplying device 4 is located above the travel path of the ceiling transport vehicle 3. However, as shown in FIGS. 11-13, the device main body 22 of the nitrogen gas supplying device 4 may be located below the travel path of the ceiling transport vehicle 3. And as shown in FIGS. 11-13, when the device main body 22 of the nitrogen gas supplying device 4 is located below the travel path of the ceiling transport vehicle 3, the nitrogen gas supplying device 4 may be suspended from and supported by the ceiling. Alternatively, the nitrogen gas supplying device 4 may be installed on the floor as in the case of the processing devices 1.

(4) In the embodiment described above, the eject nozzle 27 of the nitrogen gas supplying device 4 is provided such that it is located directly below the travel path of the ceiling transport vehicle 3. However, the eject nozzle 27 of the nitrogen gas supplying device 4 may be located to a side of the travel path of the ceiling transport vehicle 3.

More specifically, for example, as shown in FIGS. 12 and 13, a vertically movable platform 34 may be provided which is supported by the device main body 22 of the nitrogen gas supplying device 4 and which can be raised and lowered along the vertical direction by an actuating force of a first actuator device 33. And the vertically movable platform 34 supports a nozzle support 23 such that the nozzle support can be slidingly moved horizontally by an actuating force of a second actuator device 35. And after horizontally projecting the nozzle support 23 by the actuating force of the second actuator device 35, the vertically movable platform 34 may be raised by the actuating force of the first actuator device 33 to switch or change the positional relationship between the support mechanism 18 and the eject nozzle 27 from the separating positional relationship to the connecting positional relationship. When so arranged, the first actuator device 33 and the second actuator device 35 are, or correspond to, the connecting actuator device. Note that other than an electric motor, a pneumatic cylinder may be used as any of the actuator devices. And when a pneumatic cylinder is used as the actuated device, the cylinder may be configured to use the nitrogen gas from the nitrogen gas supplying device 4.

(5) In the embodiment described above, the nitrogen gas is supplied to the container W by the nitrogen gas supplying device 4 with the ceiling transport vehicle 3 stopped at the supply-purpose stop position. However, the nitrogen gas supplying device 4 may be configured to be moved along the travel path such that the nitrogen gas is supplied to the container W while moving the nitrogen gas supplying device 4 integrally, or in unison, with the ceiling transport vehicle 3 as it travels along the travel path, by connecting the eject nozzle 27 of the nitrogen gas supplying device 4 to the container W supported by the support mechanism 18 of the ceiling transport vehicle 3.

In addition, a travel path may that extends by way of a nitrogen gas supplying device 4 may be provided such that it branches off from and merges into the travel path that extends along, or by way of, processing devices 1 such that a processing device 1 and the nitrogen gas supplying device 4 are located in parallel with each other. More specifically, a looped primary path and one or more looped secondary paths each of which branches off from and merges into the looped primary path may be provided as the travel path which extends by way of the processing devices 1. And the travel path that extends by way of the nitrogen gas supplying device 4 may be provided such that it branches off from and merges into the primary path.

(6) In the embodiment described above, each container W is a FOUP for holding semiconductor substrates. However, the shape or configuration of the container and the contents held or carried by the container may be changed as appropriate. For example, a container may be a bulk container and its content may be food. In addition, besides the nitrogen gas, gaseous argon etc. may be used as the inactive gas.

Summary of Embodiments Described Above

A brief summary of the article transport facility described above is provided next.

An article transport facility comprises: an article transport vehicle configured to travel along a travel rail suspended from a ceiling to transport a container wherein the article transport vehicle includes a support portion for supporting the container; an inactive gas supplying device having an eject portion for ejecting inactive gas such that the eject portion is located to a side of, or below, a travel path along which the article transport vehicle is configured to travel; a connecting actuator device for moving the eject portion relative to the support portion to change a positional relationship between the support portion and the eject portion between a connecting positional relationship in which the eject portion is connected to the container supported by the support portion and a separating positional relationship in which the eject portion is separated from the container supported by the support portion; wherein the inactive gas supplying device is configured to eject the inactive gas from the eject portion with a connection between the eject portion and the container maintained after the positional relationship between the support portion and the eject portion is changed to the connecting positional relationship by the connecting actuator device.

With the arrangement described above, the eject portion can be connected to the container supported by the support portion of the article transport vehicle by moving the eject portion relative to the support portion with the connecting actuator device to change the positional relationship between the support portion and the eject portion to the connecting positional relationship after the article transport vehicle is caused to travel to and has reached the position that corresponds to the inactive gas supplying device.

In addition, the eject portion can be separated from the container supported by the support portion of the article transport vehicle by moving the eject portion relative to the support portion with the connecting actuator device to change the positional relationship between the support portion and the eject portion to the separating positional relationship with the article transport vehicle stopped at the position that corresponds to the inactive gas supplying device.

And the eject portion is connected to the container with the connection between the eject portion and the container maintained after the positional relationship between the support portion and the eject portion is changed to the connecting positional relationship; thus, the inactive gas can be supplied to the container when the inactive gas supplying device ejects the inactive gas from the eject portion in this state.

In addition, the article transport vehicle is located at the position corresponding to the inactive gas supplying device while the inactive gas is being supplied to the container in this manner. Thus, the container comes to be supported by the support portion of the article transport vehicle simply by changing the positional relationship between the support portion and the eject portion to the separating positional relationship by the connecting actuator device, so that the article transport vehicle is then ready to travel supporting the container with the support portion. As such, the container to which the inactive gas has been supplied by the inactive gas supplying device can be transported quickly to another location by the article transport vehicle.

And the connecting actuator device is preferably provided to the inactive gas supplying device and is preferably configured to move only the eject portion, out of the eject portion and the support portion, to change the positional relationship between the support portion and the eject portion between the connecting positional relationship and the separating positional relationship.

With the arrangement described above, since the connecting actuator device is provided to the inactive gas supplying device, there is no need to provide the connecting actuator device to the article transport vehicle. Thus, any increase in the weight and complexity of the article transport vehicle, which is configured to travel along the travel rail suspended from the ceiling, can be avoided.

In addition, the eject portion is preferably located directly below the travel path, wherein the connecting actuator device is preferably configured to raise and lower the eject portion linearly to change the positional relationship between the support portion and the eject portion between the connecting positional relationship and the separating positional relationship.

With the arrangement described above, since the connecting actuator device only needs to raise and lower the eject portion linearly, the structure of the connecting actuator device can be made simple.

In addition, the connecting actuator device is preferably provided to the article transport vehicle, and is preferably configured to move only the support portion, out of the eject portion and the support portion, to change the positional relationship between the support portion and the eject portion between the connecting positional relationship and the separating positional relationship.

With the arrangement described above, the connecting actuator device is provided to the article transport vehicle, and so there is no need to provide the connecting actuator device to the inactive gas supplying device. Thus, any increase in the complexity of the inactive gas supplying device can be avoided. In addition, for example, when the inactive gas supplying device is suspended from the ceiling, the arrangement above is also preferable in that any increase in the weight of the inactive gas supplying device can be avoided by not providing the connecting actuator device to the inactive gas supplying device.

Also, a transport subject location designated as either a transport origin or a transport destination for transporting of an article by the article transport vehicle is preferably provided directly below the travel path, wherein the inactive gas supplying device is preferably provided at a location that is displaced relative to the transport subject location along a longitudinal direction of the travel path, wherein the eject portion is preferably located directly below the travel path, wherein the article transport vehicle preferably includes an transport actuator device for raising and lowering the support portion to pick up an article from and unload an article to the transport subject location, and wherein the transport actuator device preferably also functions as the connecting actuator device.

With the arrangement described above, the positional relationship between the support portion and the eject portion can be changed between the connecting positional relationship and the separating positional relationship by raising and lowering the support portion with the transport actuator device which is provided to pick up a container from and unload a container to the transport subject location. Therefore, the transport actuator device can also be used as the connecting actuator device. And since it is not necessary to provide a connecting actuator device separately from and in addition to the transport actuator device, any increase in the weight and complexity of the article transport vehicle can be avoided even when the connecting actuator device is provided to the article transport vehicle.

In addition, preferably provided in a bottom surface of the container are an intake portion to which the eject portion is connected from below, and engaged portions that are configured to be engaged from below by positioning members which are provided integrally with the eject portion and each of which is formed to have a convex shape that projects upwardly, wherein each of the engaged portions preferably has a shape which is recessed upwardly and is tapered toward a top thereof such that lateral dimension thereof becomes progressively narrower toward the top, and wherein the connecting actuator device is preferably configured to raise and lower the eject portion relative to the support portion to change the positional relationship between the support portion and the eject portion between the connecting positional relationship and the separating positional relationship.

With the arrangement described above, by raising and lowering the eject portion relative to the support portion with the connecting actuator device after the article transport vehicle is caused to travel to and has arrived at the position that corresponds to the inactive gas supplying device, the positional relationship between the support portion and the eject portion can be changed between the connecting positional relationship and the separating positional relationship. And by so raising the eject portion relative to the support portion in this manner, the positioning members provided integrally with the eject portion are raised relative to the container supported by the support portion so that the positioning members come into engagement with the engaged portions of the container. If the container is horizontally displaced relative to the eject portion and the positioning members when this happens, the positioning members are guided by the inner surfaces of respective engaged portions so that the horizontal position of the container relative to the eject portion and the positioning members is corrected to a proper position, thus, facilitating a proper connection of the eject portion to the intake portion of the container.

Also, the support portion preferably includes a plurality of support bodies for supporting a supported portion provided to an upper end portion of the container, restriction members located to respective sides of the supported portion to restrict horizontal movement of the supported portion when the supported portion is supported by the plurality of support bodies, and a switching actuator device for changing between a support state in which the plurality of support bodies are located closer to each other than in a support releasing state, and the support releasing state in which the plurality of support bodies are spaced farther apart from each other than in the support state, and wherein the inactive gas supplying device is preferably configured to eject the inactive gas from the eject portion with the support portion changed to the support state by the switching actuator device.

With the arrangement described above, after connecting the eject portion to the container by changing the positional relationship between the support portion and the eject portion to the connecting positional relationship with the connecting actuator device, the inactive gas supplying device ejects inactive gas from the eject portion to supply inactive gas to the container without changing the state of the support portion from the support state to the support releasing state. Thus, it is not necessary to change the support portion from the support state to the support releasing state after connecting the container to the eject portion and before the inactive gas supplying device ejects the inactive gas from the eject portion. Therefore, the supplying of the inactive gas into the container can be started quickly.

In addition, when the support portion is in the support state, the restriction members of the support portion are located to the sides of the supported portion of the container. Thus, even if, for example, the container is lifted by the connecting actuator device and the supported portion is lifted from the support bodies, the supported portion provided to the upper end portion of the container would come into contact with the restriction members of the support portion, thus, preventing the container from falling over.

In addition, the inactive gas supplying device is preferably configured to eject the inactive gas from the eject portion with the article transport vehicle stopped at a supply-purpose stop position defined in advance relative to the inactive gas supplying device.

With the arrangement described above, there is no need to move the inactive gas supplying device to follow the movement of the article transport vehicle as it travels. Thus the inactive gas supplying device can be fixedly provided, simplifying the structure of the inactive gas supplying device.

What is claimed is:
1. An article transport facility comprising:
an article transport vehicle configured to travel along a travel rail suspended from a ceiling to transport a container wherein the article transport vehicle includes a support portion for supporting the container;
an inactive gas supplying device having an eject portion for ejecting inactive gas such that the eject portion is located to a side of, or below, a travel path along which the article transport vehicle is configured to travel;
a connecting actuator device for moving the eject portion relative to the support portion to change a positional relationship between the support portion and the eject portion between a connecting positional relationship in which the eject portion is connected to the container supported by the support portion and a separating positional relationship in which the eject portion is separated from the container supported by the support portion, wherein the inactive gas supplying device is configured to eject the inactive gas from the eject portion with a connection between the eject portion and the container maintained after the positional relationship between the support portion and the eject portion is changed to the connecting positional relationship by the connecting actuator device, wherein the connecting actuator device is provided to the inactive gas supplying device and is configured to move only the eject portion, out of the eject portion and the support portion, to change the positional relationship between the support portion and the eject portion between the connecting positional relationship and the separating positional relationship, wherein the eject portion is located directly below the travel path, and wherein the connecting actuator device is configured to raise and lower the eject portion linearly to change the positional relationship between the support portion and the eject portion between the connecting positional relationship and the separating positional relationship.

2. The article transport facility as defined in claim 1, wherein the support portion includes a plurality of support bodies for supporting a supported portion provided to an upper end portion of the container, restriction members located to respective sides of the supported portion to restrict horizontal movement of the supported portion when the supported portion is supported by the plurality of support bodies, and a switching actuator device for changing between a support state in which the plurality of support bodies are located closer to each other than in a support releasing state, and the support releasing state in which the plurality of support bodies are spaced farther apart from each other than in the support state, and wherein the inactive gas supplying device is configured to eject the inactive gas from the eject portion with the support portion changed to the support state by the switching actuator device.

3. The article transport facility as defined in claim 1, wherein the inactive gas supplying device is configured to eject the inactive gas from the eject portion with the article transport vehicle stopped at a supply-purpose stop position defined in advance relative to the inactive gas supplying device.

4. An article transport facility comprising:
an article transport vehicle configured to travel along a travel rail suspended from a ceiling to transport a container wherein the article transport vehicle includes a support portion for supporting the container;
an inactive gas supplying device having an eject portion for ejecting inactive gas such that the eject portion is located to a side of, or below, a travel path along which the article transport vehicle is configured to travel;
a connecting actuator device for moving the eject portion relative to the support portion to change a positional relationship between the support portion and the eject portion between a connecting positional relationship in which the eject portion is connected to the container supported by the support portion and a separating positional relationship in which the eject portion is separated from the container supported by the support portion, wherein the inactive gas supplying device is configured to eject the inactive gas from the eject portion with a connection between the eject portion and the container maintained after the positional relationship between the support portion and the eject portion is changed to the connecting positional relationship by the connecting actuator device, wherein the connecting actuator device is provided to the article transport vehicle, and is configured to move only the support portion, out of the eject portion and the support portion, to change the positional relationship between the support portion and the eject portion between the connecting positional relationship and the separating positional relationship, wherein a transport subject location designated as either a transport origin or a transport destination for transporting of an article by the article transport vehicle is provided directly below the travel path, wherein the inactive gas supplying device is provided at a location that is displaced relative to the transport subject location along a longitudinal direction of the travel path, wherein the eject portion is located directly below the travel path, wherein the article transport vehicle includes a transport actuator device for raising and lowering the support portion to pick up an article from and unload an article to the transport subject location, and wherein the transport actuator device also functions as the connecting actuator device.

5. The article transport facility as defined in claim 4, wherein the support portion includes a plurality of support bodies for supporting a supported portion provided to an upper end portion of the container, restriction members located to respective sides of the supported portion to restrict horizontal movement of the supported portion when the supported portion is supported by the plurality of support bodies, and a switching actuator device for changing between a support state in which the plurality of support bodies are located closer to each other than in a support releasing state, and the support releasing state in which the plurality of support bodies are spaced farther apart from each other than in the support state, and
wherein the inactive gas supplying device is configured to eject the inactive gas from the eject portion with the support portion changed to the support state by the switching actuator device.

6. The article transport facility as defined in claim 4, wherein the inactive gas supplying device is configured to eject the inactive gas from the eject portion with the article transport vehicle stopped at a supply-purpose stop position defined in advance relative to the inactive gas supplying device.

7. An article transport facility comprising:
an article transport vehicle configured to travel along a travel rail suspended from a ceiling to transport a container wherein the article transport vehicle includes a support portion for supporting the container;
an inactive gas supplying device having an eject portion for ejecting inactive gas such that the eject portion is located to a side of, or below, a travel path along which the article transport vehicle is configured to travel;
a connecting actuator device for moving the eject portion relative to the support portion to change a positional relationship between the support portion and the eject portion between a connecting positional relationship in which the eject portion is connected to the container supported by the support portion and a separating positional relationship in which the eject portion is separated from the container supported by the support portion, wherein the inactive gas supplying device is configured to eject the inactive gas from the eject portion with a connection between the eject portion and the container maintained after the positional relationship between the support portion and the eject portion is changed to the connecting positional relationship by the connecting actuator device, wherein provided in a bottom surface of the container are an intake portion to which the eject portion is connected from below, and engaged portions that are configured to be engaged from below by positioning members which are provided integrally with the eject portion and each of which is formed to have a convex shape that projects upwardly, wherein each of the engaged portions has a shape which is recessed upwardly and is tapered toward a top thereof such that lateral dimension thereof becomes progressively narrower toward the top, and wherein the connecting actuator device is configured to raise and lower the eject portion relative to the support portion to change the positional relationship between the support portion and the eject portion between the connecting positional relationship and the separating positional relationship.

8. The article transport facility as defined in claim 7, wherein the support portion includes a plurality of support bodies for supporting a supported portion provided to an upper end portion of the container, restriction members located to respective sides of the supported portion to restrict horizontal movement of the supported portion when the supported portion is supported by the plurality of support bodies, and a switching actuator device for changing between a support state in which the plurality of support bodies are located closer to each other than in a support releasing state, and the support releasing state in which the plurality of support bodies are spaced farther apart from each other than in the support state, and wherein the inactive gas supplying device is configured to eject the inactive gas from the eject portion with the support portion changed to the support state by the switching actuator device.

9. The article transport facility as defined in claim 8, wherein the inactive gas supplying device is configured to eject the inactive gas from the eject portion with the article transport vehicle stopped at a supply-purpose stop position defined in advance relative to the inactive gas supplying device.

* * * * *

UNITED STATES PATENT AND TRADEMARK OFFICE
CERTIFICATE OF CORRECTION

PATENT NO. : 9,583,370 B2  
APPLICATION NO. : 14/937213  
DATED : February 28, 2017  
INVENTOR(S) : Ayato Takada It is certified that error appears in the above-identified patent and that said Letters Patent is hereby corrected as shown below:

In the Claims

Column 20, Line 19, Claim 9, delete "claim 8," and insert -- claim 7, --

Signed and Sealed this  
Twenty-seventh Day of June, 2017

Joseph Matal  
*Performing the Functions and Duties of the*  
*Under Secretary of Commerce for Intellectual Property and*  
*Director of the United States Patent and Trademark Office*